United States Patent [19]

Feldman

[11] Patent Number: 4,636,080
[45] Date of Patent: Jan. 13, 1987

[54] TWO-DIMENSIONAL IMAGING WITH LINE ARRAYS

[75] Inventor: Martin Feldman, Berkeley Heights, N.J.

[73] Assignee: AT&T Bell Laboratories, Murray Hill, N.J.

[21] Appl. No.: 607,956

[22] Filed: May 7, 1984

[51] Int. Cl.[4] ............................................. G01B 11/00
[52] U.S. Cl. .................................... 356/401; 356/363
[58] Field of Search ................................. 356/399–401, 356/375, 363, 351, 358

[56] References Cited

U.S. PATENT DOCUMENTS

| | | | |
|---|---|---|---|
| 3,813,169 | 5/1974 | Kaestner | 356/399 X |
| 4,037,969 | 7/1977 | Feldman et al. | 356/401 |
| 4,188,122 | 2/1980 | Massie et al. | 356/351 X |
| 4,207,002 | 6/1980 | Gara et al. | 356/375 |
| 4,326,805 | 4/1982 | Feldman et al. | 356/399 |
| 4,341,472 | 7/1982 | Gorog et al. | 356/375 X |
| 4,350,443 | 9/1982 | Williamson | 356/358 |
| 4,398,824 | 8/1983 | Feldman et al. | 356/401 |
| 4,531,060 | 7/1985 | Suwa et al. | 356/400 X |

Primary Examiner—Davis L. Willis
Attorney, Agent, or Firm—Lucian C. Canepa

[57] ABSTRACT

One or two linear arrays of photodetectors are combined with optical elements to form an arrangement capable of determining the X-Y location of a focused laser beam or other light spot. The resulting arrangement is characterized by low cost and by excellent resolution, stability and linearity. Moreover, the arrangement provides output data that can be easily and quickly processed. The combination is adapted, for example, for use with zone plates in aligning masks and wafers in semiconductor fabrication.

1 Claim, 7 Drawing Figures

TWO-DIMENSIONAL IMAGING WITH LINE ARRAYS

BACKGROUND OF THE INVENTION

This invention relates to locating the position of a spot of light and, more particularly, to techniques for determining the X-Y location of a focused laser beam.

In a variety of applications of practical importance, it is necessary to be able to determine the location of a focused light beam. In one such important application, it is necessary to locate the X-Y position of the waist of a focused laser beam formed by a zone plate member. Such members are utilized, for example, on masks and/or wafers for alignment purposes during manufacture of semiconductor devices, as described in detail in U.S. Pat. Nos. 4,037,969, 4,326,805 and 4,398,824.

Various instrumentalities are known for use in a zone plate alignment system to ascertain beam location. One such standard instrumentality comprises a television camera and an associated microprocessor. But efforts by workers in the art have continued to be directed at trying to devise even better ways of carrying out the location function. It was realized that such efforts, if successful, has the potential for improving the alignment capabilities of a zone plate system, and thereby also for improving the quality and reducing the costs of semiconductor devices made utilizing such a system.

SUMMARY OF THE INVENTION

Hence, an object of the present invention is an improved way of locating the position of a light beam. More specifically, an object of this invention is an improved apparatus and method for determining the X-Y location of a focused laser beam in a zone plate alignment system.

Briefly, these and other objects of the present invention are realized in a specific illustrative embodiment thereof that includes two line arrays of photodetectors. One array extends in the X direction and the other in the Z direction. In this embodiment, a beam splitter is positioned in the path of light emanating from a spot whose X-Y location is to be determined. The splitter divides the input beam into two spatially separate beams. One of these components is directed by a first cylindrical lens onto the X-directed array. The other beam component is directed by a second cylindrical lens onto the Z-directed array. The X-directed array provides output signals that are uniquely representative of the X-direction position of the light spot. This array, however, is insensitive to the Y-direction position of the spot. On the other hand, the Z-directed array provides output signals that are uniquely representative of the Y-direction position of the light spot. But the Z-directed array is insensitive to the X-direction position of the spot. In that way, unique X-position and Y-position signals representative of the location of the light spot are provided.

In other specific illustrative embodiments of applicant's invention, a single line array of photodetectors suffices to determine both X and Y coordinates of a light spot. In one such particular embodiment, only a Dove prism and a cylindrical lens are interposed between the spot and the single array. Mechanical rotation of the prism by 45 degrees in effect interchanges the X and Y coordinates. Sequential output signals provided by the single array are thus respectively representative of the X and Y positions of the input spot.

In another single-array embodiment, a polarizing beam splitter is utilized to form two differently polarized beams derived from a light spot whose X-Y location is to be determined. One beam is directed onto a single X-directed array via a first optical assembly that includes a quarter wave plate, a mirror, the beam splitter and a first cylindrical lens. The other beam is directed onto the single array via a second optical assembly that comprises a quarter wave plate, a second cylindrical lens, a mirror, the beam splitter and the first cylindrical lens. The first optical assembly provides a light signal on the array that is uniquely representative of the X-direction position of the light spot but that is insensitive to the Y-direction position of the spot. The second assembly provides a signal on the array that is uniquely representative of the Y-direction position of the spot but that is insensitive to the X-direction position of the spot.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

For illustrative purposes, emphasis herein will be directed to embodiments of applicant's invention included in a zone plate alignment system of the general type described in the aforecited patents. Such a system, utilizing, for example, laser-beam-illuminated zone plates, is advantageous for use in semiconductor fabrication equipment such as optical step-and-repeat cameras and X-ray proximity printers.

In a zone plate alignment system, zone plates formed on masks and/or wafers whose surfaces lie in X-Y planes are effective to focus incident light to form image spots at prescribed distances from the zone plates. Determining the location of each such spot in an X-Y plane parallel to the mask or wafer surface provides a basis for precisely positioning the mask or wafer relative to a prescribed location.

Applicant's below-described embodiments constitute advantageous ways of determining the coordinates of a light spot in an X-Y plane. In each embodiment, one or two standard linear arrays of photodetectors are utilized in a unique way to provide the coordinate information with high precision relative to that obtained, for example, with a standard split photodiode.

Linear arrays of photodetectors are known to have excellent linearity, stability and resolution characteristics. Such arrays are therefore employed in various practical applications where one-dimensional positional information is desired. But the art is devoid of any suggestion of utilizing such arrays with their attendant excellent characteristics to determine both X and Y location of a light spot in the particular unique ways described herein. Significantly, the use of linear arrays in these ways makes possible the realization of economical systems exhibiting both high accuracy and relatively simple high-speed processing.

Figure 1:
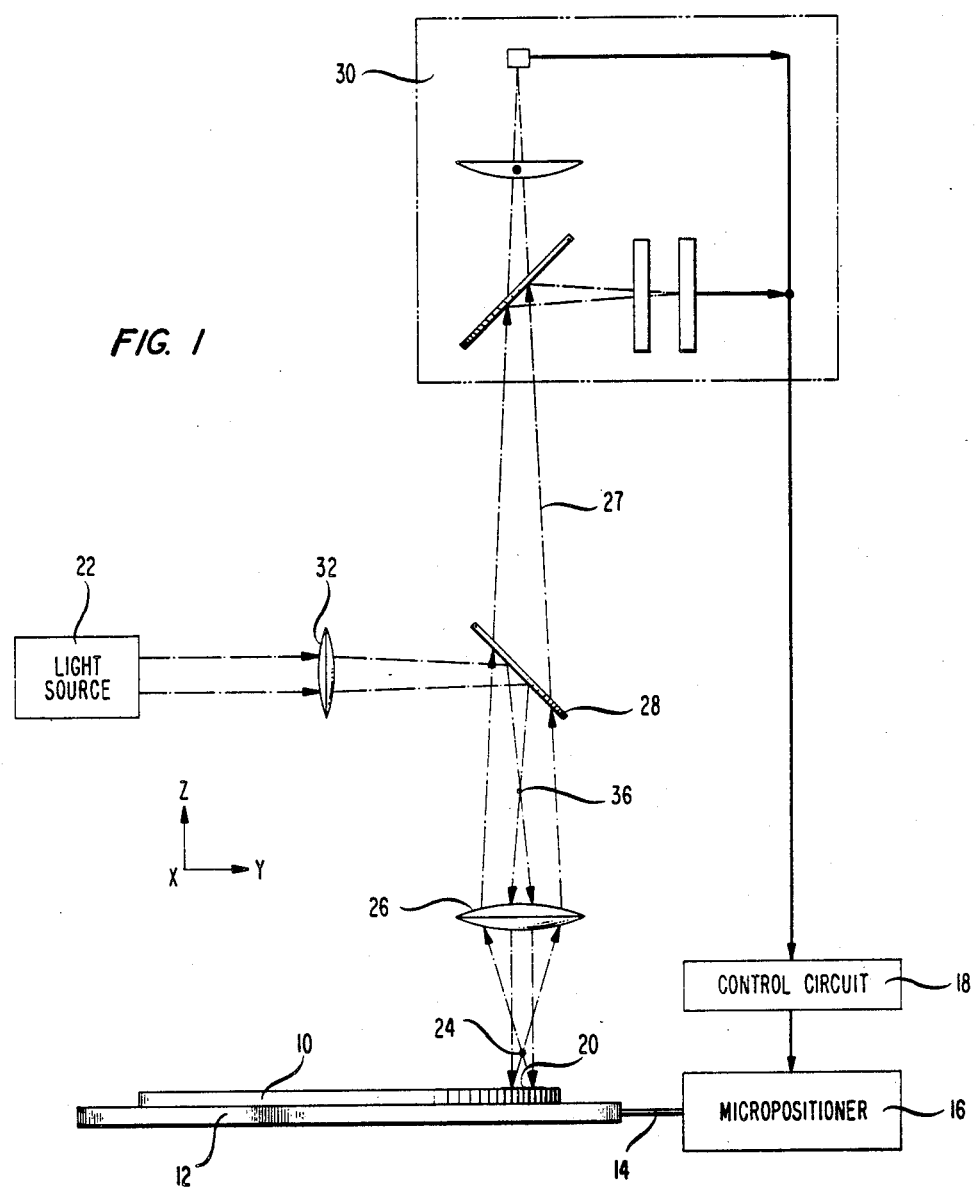
FIG. 1 is a schematic representation of a zone plate alignment system that includes as a component arrangement thereof a specific illustrative two-array embodiment of the principles of the present invention.

For ease of explanation and so as not to unduly complicate the drawing, FIG. 1 shows in rudimentary form a simple zone plate alignment system adapted to position a semiconductor wafer 10 in a predetermined location in a plane parallel to the indicated X-Y reference plane. The wafer 10 is positioned on an X-Y movable table 12 that is mechanically connected by coupler 14 to a standard micropositioner 16. The micropositioner is adapted to move the table 12 in X and Y directions in response to signals provided by control circuit 18.

The wafer 10 of FIG. 1 includes thereon a standard zone plate mark 20. When illuminated by light from source 22, the mark 20 forms a focused image at spot 24. This spot is, for example, located in an X-Y parallel plane approximately 200 micrometers above the top surface of the wafer 10. In turn, light emanating from the spot 24 is formed into a converging spherical beam by lens 26. A portion 27 of this beam propagates through beam splitter 28 in the Z direction and impinges upon assembly 30 which constitutes one specific illustrative embodiment of the present invention. The assembly 30 is shown in enlarged form in FIG. 2 and will be described in detail later below.

By way of example, the light source 22 shown in FIG. 1 comprises a laser that provides a parallel-ray output beam at a wavelength of 6328 Angstrom units. Illustratively, the light emanating from the source 22 is formed into a converging spherical beam by lens 32. A portion of this beam is directed by the beam splitter 28 to form an image spot 36. Light from the spot 36 is then converted into a parallel-ray beam by the lens 26. This parallel-ray beam serves as the aforementioned illumination for the zone plate mark 20.

Figure 2:
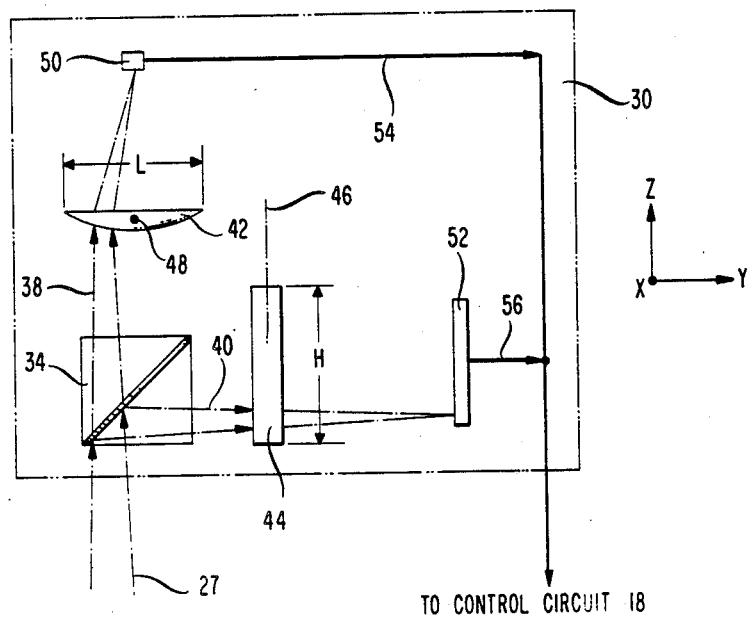
FIG. 2 is an enlarged version of a portion of the inventive embodiment depicted in FIG. 1.

As indicated above, the assembly 30 of FIG. 1 is shown in enlarged form in FIG. 2. Input beam 27 in FIG. 2 is directed at a standard beam splitter 34 included in the assembly 30. As a result of the action of the beam splitter 34, a first portion 38 of the input beam is directed parallel to the Z axis and a second portion 40 is directed parallel to the Y axis. The first beam portion 38 propagates through a first standard cylindrical lens 42, and the second portion 40 propagates through a second standard cylindrical lens 44 whose main axis 46 is rotated 90 degrees with respect to the main axis 48 of the lens 42.

Illustratively, the beam 27 (FIG. 2) incident on the beam splitter 34 is a converging spherical beam having a diameter of approximately 400 micrometers at its intersection with the lower or input face of the beam splitter 34. By way of example, the splitter 34 constitutes a cube each of whose faces measures about one centimeter by one centimeter. Further, the length L and the height H of each of the lenses 42 and 44 are, for example, each about one centimeter. The focal length of each lens is approximately five centimeters.

A standard linear array of photodetectors is positioned in the focal plane of each of the cylindrical lenses 42 and 44 of FIG. 2. One array 50 associated with the lens 42 is oriented parallel to the X axis. A second array 52 associated with the lens 44 is oriented parallel to the Z axis. Illustratively, each array is about one centimeter long and comprises 1000 individual photodetectors each approximately 10 micrometers wide and 500 micrometers high.

Light focused by the cylindrical lens 42 of FIG. 2 is directed onto a specified portion of the X-directed array 50. For a particular X-direction position of the input beam 27, the same specified portion of the array 50 continues to be illuminated regardless of the Y-direction position of the input beam. In other words, the lens 42 and the array 50 are in effect insensitive to Y-direction movement of the beam. A different specified portion of the array 50 will be illuminated only if the input beam 27 moves in the X direction. Accordingly, it is apparent that the electrical output of the array 50 appearing on bus 54 is uniquely representative of the X-direction position of the input beam 27.

Similarly, light focused by the cylindrical lens 44 of FIG. 2 is directed onto a specified portion of the Z-directed array 52. For a particular Y-direction position of the input beam 27, the same specified portion of the array 52 continues to be illuminated regardless of the X-direction position of the input beam. In other words, the lens 44 and the array 52 are in effect insensitive to X-direction movement of the beam. A different specified portion of the array 52 will be illuminated only if the input beam 27 moves in the Y direction. Accordingly, it is apparent that the electrical output of the array 52 appearing on bus 56 is uniquely representative of the Y-direction position of the input beam 27.

By means of the assembly 30 shown in FIG. 2, it is thus possible to provide electrical output signals representative of the X-Y coordinates of the input beam 27 and hence of the spot 24 (FIG. 1). In turn, these signals are applied to the control circuit 18 (FIG. 1) where a determination is made as to whether or not the actual position of the beam corresponds with a prescribed position. If there is a lack of correspondence therebetween, the micropositioner 16 is controlled by the circuit 18 to move the table 12 to a location where the actual and prescribed positions will be the same. In that way, accurate alignment of the wafer 10 is achieved.

No ambiguity exists in the FIG. 2 assembly for the case of a single input light beam. However, if more than one input beam is present at a time, it may not always be clear which X coordinate value is associated with which Y value. But in many cases of practical importance, enough is known about the relative positions of the input beams that an unequivocal basis does exist for distinguishing among plural beams. Thus, for example, if the input beams are known to lie roughly along a diagonal for the input face of the splitter 34, it is apparent that the smallest X value is associated with the smallest Y value, etc. Similarly, if the intensities of the input beams are not exactly equal, this may be used as a basis for distinguishing among plural beams. Thus, for example, the least intense signal in the X linear array produces an X value that is associated with the Y value produced by the least intense signal in the Y linear array, etc.

In accordance with the principles of the present invention, applicant has devised other arrangements in which a single linear array of photodetectors suffices to obtain both X and Y coordinate information concerning the location of a light spot. Illustratively, this is done by rotating or inverting the original two-dimensional input to form a second input. Both inputs are then directed to the single array, either sequentially (as described below in connection with FIGS. 3 and 4) or simultaneously (as described below in connection with FIGS. 5 through 7).

Figure 3:
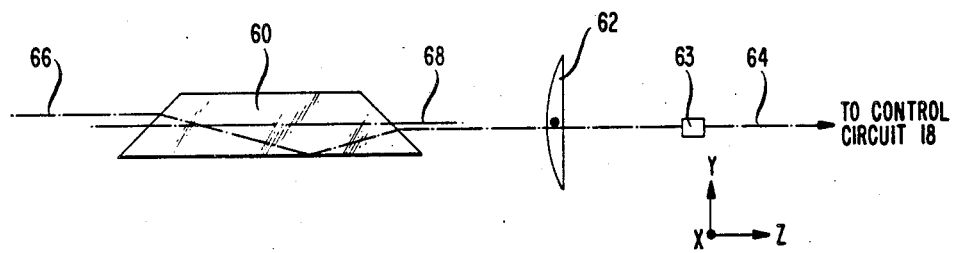
FIGS. 3 and 4 are views of a particular one-array embodiment of applicant's invention, which embodiment includes a rotatable prism as a component thereof.

As indicated, FIG. 3 shows a specific illustrative embodiment of the present invention in which X and Y coordinate information is generated sequentially. The embodiment comprises a conventional Dove prism 60, a standard cylindrical lens 62 and a single linear X-directed array 63 of photodetectors.

With the prism 60 positioned as shown in FIG. 3, the depicted arrangement provides output signals on bus 64 that are uniquely representative of the X position of input beam 66. For a given X position, a specified portion of the array 64 is illuminated regardless of the Y position of the beam 66.

Figure 4:
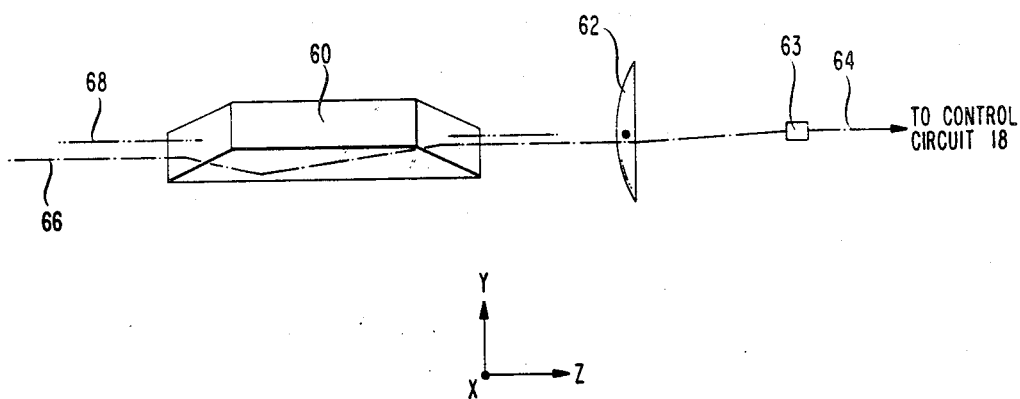

By rotating the prism 60 of FIG. 3 by 45 degrees about axis 68, the input configuration is rotated by 90 degrees. In effect, this interchanges the X and Y coordinates of the input spot whose location is to be determined. Thus, the prism-rotated arrangement of FIG. 4 provides output signals on the bus 64 that are uniquely representative of the Y position of input beam 66. For a given Y position, a specified portion of the array 64 is illuminated regardless of the X position of the beam 66.

Figure 5:
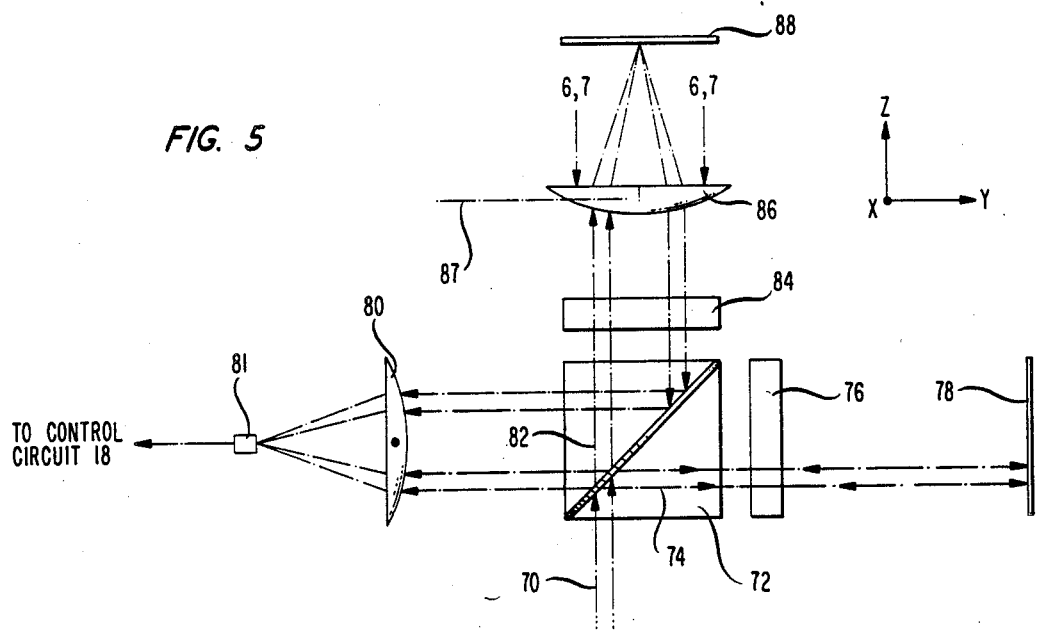
FIG. 5 shows another specific illustrative one-array embodiment of the present invention.

An advantageous single-array embodiment that does not depend on mechanical rotation of any of the elements thereof is schematically represented in FIG. 5. In this embodiment, input beam 70 is directed at the lower or input face of a standard polarizing beam splitter 72. Illustratively, the input beam is circularly polarized or plane polarized at 45 degrees. A first portion 74 of the input beam characterized by a first polarization condition is directed to the right by the splitter 72 through a quarter-wave plate 76 onto a mirror 78. After being reflected from the mirror 78, this portion traverses the plate 76 again and then propagates straight through the splitter 72 to impinge upon cylindrical lens 80. In turn, the lens 80 focuses this beam onto a portion of a linear array 81 of photodetectors.

A second portion 82 of the input beam characterized by a second polarization condition is directed upwards by the splitter 72 through a quarter-wave plate 84 to a cylindrical lens 86. The lens 86, whose axis 87 is disposed at 45 degrees with respect to the Y-Z plane, directs the beam portion 82 onto a mirror 88. After reflection from the mirror 88, the portion 82 is directed by the lens 86 through the plate 84 again and into the beam splitter 72. In turn, the splitter 72 directs the portion 82 to the left to the lens 80 which focuses the beam onto a portion of the array 81.

Two major considerations are important in designing an arrangement of the type shown in FIG. 5. First, the two spatially separated beams 74 and 82 should advantageously be of orthogonal polarizations so as to prevent interference effects when the beams are both directed onto the array 81. Second, the paths respectively traversed by the beams 74 and 82 should advantageously be of the same length so that, for a converging input beam 70, both of the beams 74 and 82 will come to a focus on the array 81.

In an arrangement of the type described in FIG. 5, some ambiguity may exist as to which of the two signals provided by the array 81 is representative of the X position of the spot whose location is being determined and which is representative of the Y position thereof. In many cases of practical importance, however, enough will be known a priori about spot location to resolve the ambiguity. In other cases, it is advantageous to polarize the input beam at some angle significantly different from 45 degrees. In that way, the respective X- and Y-coordinate beams exhibit different intensities which provides a basis for distinguishing between the output signals generated by the array 81.

For a given X-direction position, the portion 74 of the input beam 70 shown in FIG. 5 is directed by the lens 80 onto a specified portion of the array 81 regardless of the Y-direction position of the beam 70. In other words, the signal provided by the array 81 in response to the beam portion 74 is sensitive to and uniquely representative of the X-direction position of the input beam but insensitive to the Y-direction position thereof.

Figure 6:
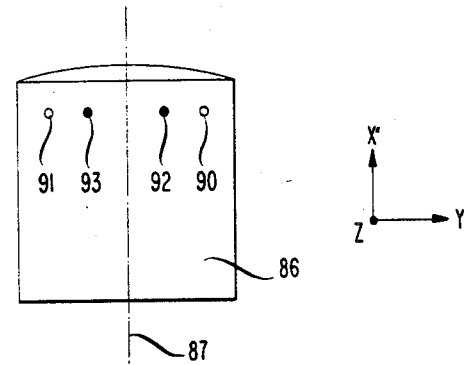
FIGS. 6 and 7 are schematic depictions helpful in explaining the mode of operation of the FIG. 5 arrangement.

If the cylindrical lens 86 of FIG. 5 were oriented with its axis parallel to the X direction (as is the lens 80), the lens 86 would also be insensitive to Y-direction movement of the input beam. This orientation (which, of course, is not that included in applicant's FIG. 5 embodiment) is illustrated in FIG. 6 which depicts the flat face of the lens 86 as viewed in the direction of arrows 6 shown in FIG. 5. As indicated, axis 87 is parallel to the X axis. Input beam 90 shown in FIG. 6 would be reflected by the mirror 88 (FIG. 5) and re-enter the lens 86 as beam 91. For another Y-direction location of the input beam, the beam portion shown in FIG. 6 is designated 92. After reflection from the mirror 88, that portion re-enters the lens 86 as beam 93. It is evident that both beams 91 and 93 and all other beams at this same X-direction location would be directed to the lens 80 and focused onto the same portion of the array 81.

In accordance with the principles of applicant's invention, the axis 87 of the lens 86 shown in FIG. 5 is oriented at 45 degrees with respect to the plane of the paper on which FIG. 5 is drawn. The rotated axis 87 is also depicted in FIG. 7 which is a view of the flat face of the lens 86 as viewed in the direction of arrows 7 shown in FIG. 5.

Figure 7:
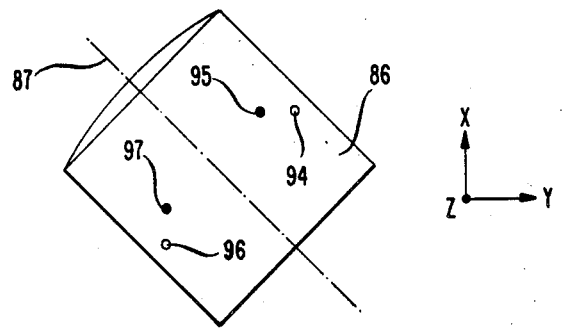

FIG. 7 shows the manner in which two different beams 94 and 95 spaced apart in the Y direction at a given X position are transposed by the rotated cylindrical lens 86 to form respective beams 96 and 97. Significantly, the beams 96 and 97 are spaced apart in the X direction at the same Y position. Because of this transposition, it is apparent that the beams 96 and 97 are directed by the lens 80 to different portions of the linear array 81. Accordingly, it is evident that the unique compact single-array assembly shown in FIG. 5 exhibits a sensitivity to both X-direction and Y-direction movement of the input beam 70.

Finally, it is to be understood that the above-described arrangements and techniques are only illustrative of the principles of the present invention. In accordance with these principles, numerous modifications and alternatives may be devised by those skilled in the art without departing from the spirit and scope of the invention. For example, one could replace cylindrical lens 86 and mirror 88 of FIG. 5 with a standard roof prism.

What is claimed is:

1. In combination in a zone plate alignment system, means for illuminating a zone plate mark, a member having a zone plate alignment mark thereon responsive to said illuminating means for forming an image spot a predetermined distance from the surface of said member in an X-Y plane, means responsive to light from said image spot for providing first and second beams respectively representative of the X and Y coordinates of said spot, and means including at least one cylindrical lens and at least one linear array of photodetectors interposed in the path of said beams providing electrical output signals representative of the coordinates of said spot in said X-Y plane, wherein said last-mentioned means comprises a polarizing beam splitter interposed in the path of said light for providing first and second beams, a first quarter-wave plate, a first cylindrical lens and a first mirror interposed in that order in the path of said first beam, said first mirror being positioned to reflect said first beam back through said first lens and said first quarter-wave plate into said beam splitter and towards a second cylindrical lens, a second quarter-wave plate and a second mirror interposed in that order in the path of said second beam, said first mirror being positioned to reflect said second beam back through said second quarter-wave plate into said beam splitter and towards said second cylindrical lens, and a single linear array of photodetectors associated with said second lens and positioned to have said first and second beams focused on said array by said second lens, wherein said array extends parallel to the main longitudinal axis of said second lens and wherein the main longitudinal axis of said first lens is disposed at 45 degrees with respect to the main longitudinal axis of said second lens.

* * * * *